United States Patent
Zou et al.

(10) Patent No.: US 9,930,453 B2
(45) Date of Patent: Mar. 27, 2018

(54) SILICON MICROPHONE WITH HIGH-ASPECT-RATIO CORRUGATED DIAPHRAGM AND A PACKAGE WITH THE SAME

(71) Applicant: GOERTEK INC., WeiFang (CN)

(72) Inventors: Quanbo Zou, WeiFang (CN); Zhe Wang, WeiFang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 15/119,116

(22) PCT Filed: Jul. 15, 2014

(86) PCT No.: PCT/CN2014/082266
§ 371 (c)(1),
(2) Date: Aug. 15, 2016

(87) PCT Pub. No.: WO2016/008106
PCT Pub. Date: Jan. 21, 2016

(65) Prior Publication Data
US 2017/0055081 A1    Feb. 23, 2017

(51) Int. Cl.
| H04R 7/14 | (2006.01) |
| H04R 19/01 | (2006.01) |
| B81C 1/00 | (2006.01) |
| B81B 3/00 | (2006.01) |
| H04R 1/04 | (2006.01) |
| H04R 19/04 | (2006.01) |

(52) U.S. Cl.
CPC ............. H04R 7/14 (2013.01); B81B 3/0021 (2013.01); B81C 1/0023 (2013.01); H04R 1/04 (2013.01);
(Continued)

(58) Field of Classification Search
CPC .............................. H04R 19/005; H04R 19/04; H04R 2201/003; H04R 1/04; H04R 31/006;
(Continued)

(56) References Cited

U.S. PATENT DOCUMENTS

| 9,344,808 B2 * | 5/2016 | Chan ........................ H04R 1/08 |
| 2006/0057737 A1 * | 3/2006 | Santini, Jr. ........... A61K 9/0009 |
| | | 436/174 |

(Continued)

FOREIGN PATENT DOCUMENTS

| CN | 200983677 Y | 11/2007 |
| CN | 101267689 A | 9/2008 |

(Continued)

OTHER PUBLICATIONS

Office Action from Chinese Patent Office for Application No. 201480037949.7, dated Feb. 16, 2017.
(Continued)

*Primary Examiner* — Joshua Kaufman (57) ABSTRACT

The present invention provides a silicon microphone with a high-aspect-ratio corrugated diaphragm and a microphone package including the same. The microphone comprises the corrugated diaphragm on which at least one ring-shaped corrugation is formed in the vicinity of the edge of the diaphragm which is fixed to the substrate, the corrugated diaphragm is flexible, wherein the ratio of the depth of the corrugation to the thickness of the diaphragm is larger than 5:1, preferably 20:1, and the walls of the corrugation are inclined to the surface of the diaphragm at an angle in the range of 80° to 100°. The microphone with the high-aspect-ratio corrugated diaphragm can achieve a consistent and optimal sensitivity and greatly reduce impact applied thereto in a drop test so that the performances, the reproducibility, the reliability and the yield can be improved. The microphone package of the present invention further provides a simplified processing, an improved sensitivity and an improved SNR.

12 Claims, 4 Drawing Sheets

(52) U.S. Cl.
CPC ........... *H04R 19/016* (2013.01); *H04R 19/04* (2013.01); *B81B 2201/0257* (2013.01); *B81B 2203/019* (2013.01); *B81B 2203/0127* (2013.01); *B81C 2201/115* (2013.01); *H01L 2224/48091* (2013.01); *H01L 2224/73265* (2013.01); *H01L 2924/15192* (2013.01); *H04R 2201/003* (2013.01); *H04R 2307/027* (2013.01)

(58) Field of Classification Search
CPC ............................ H04R 7/14; H04R 2307/027; H04R 2499/11; H04R 7/00; H04R 7/06; B81B 2201/0257; B81B 2203/0127; B81B 3/0072; B81B 3/0021; B81B 3/001; B81B 3/0018; B81B 2203/019; B81B 2207/012; B81B 3/0035; B81B 3/007

See application file for complete search history.

(56) References Cited

U.S. PATENT DOCUMENTS

| | | |
|---|---|---|
| 2006/0233401 A1 | 10/2006 | Wang |
| 2011/0233692 A1* | 9/2011 | Inoda ..................... H04R 19/04 257/416 |
| 2012/0091546 A1* | 4/2012 | Langereis ............. B81B 3/0072 257/416 |
| 2012/0207332 A1* | 8/2012 | Dehe ...................... H04R 1/403 381/182 |
| 2013/0028459 A1 | 1/2013 | Wang |
| 2013/0140655 A1* | 6/2013 | Yeh ......................... H01L 21/56 257/416 |

FOREIGN PATENT DOCUMENTS

| | | |
|---|---|---|
| CN | 101835079 A | 9/2010 |
| CN | 101931852 A | 12/2010 |
| CN | 102244832 A | 11/2011 |
| CN | 102826502 A | 12/2012 |

OTHER PUBLICATIONS

International Search Report for International Patent Application No. PCT/CN2014/082266 filed on Jul. 15, 2014.

Office Action from Chinese Patent Ofiice for Application No. 201480037949.7, dated Jul. 29, 2016.

* cited by examiner

SILICON MICROPHONE WITH HIGH-ASPECT-RATIO CORRUGATED DIAPHRAGM AND A PACKAGE WITH THE SAME

CROSS-REFERENCE TO RELATED APPLICATIONS

The present specification is a U.S. National Stage of International Patent Application No. PCT/CN2014/082266, filed Jul. 15, 2014, the disclosure of which is hereby incorporated in its entirety by reference.

FIELD OF THE INVENTION

The present invention relates to the field of microphone technology, and more specifically, to a silicon microphone with a high-aspect-ratio corrugated diaphragm and a package with the same.

BACKGROUND

Silicon microphones, or silicon based MEMS microphones, also known as acoustic transducers, have been in research and development for many years. The silicon microphones may be widely used in many applications, such as cell phones, tablet PCs, cameras, hearing aids, smart toys and surveillance devices due to their potential advantages in miniaturization, performances, reliability, environmental endurance, costs and mass production capability.

A typical silicon microphone comprises a highly flexible diaphragm stacked on a silicon substrate and exposed to the outside through a back hole formed in the silicon substrate, and a fixed perforated backplate located above the diaphragm with an air gap in between. The flexible diaphragm and the perforated backplate forms a variable air-gap condenser, which can convert acoustic energy into electric energy for detection when the diaphragm vibrates in response to an external acoustic wave or a sound pressure impact reaching the diaphragm through the back hole.

As a critical part of the silicon microphone, the diaphragm play a very important role in determining the performances of the microphone, for example, large tensile stress in the diaphragm can lead to undesirable effects such as low and irreproducible sensitivity of the microphone. Therefore, it is one of major subject matters for a microphone designer to reduce the stress in the diaphragm in order to improve the performances, such as sensitivity and reproducibility, of the microphone.

Patent application No. PCT/CN2013/080908 disclosed a silicon microphone with a stopper structure, in which a narrow slot is formed around the edge of the diaphragm to release the stress in the diaphragm, however, the slot makes the microphone fragile in a drop test, and the stopper structure introduced for improving drop performance nevertheless increases process complexity and thus yields a cost concern. Other stress-free diaphragm designs, such as the floating diaphragm scheme of Knowles Corporation, the folded-spring supported diaphragm scheme of Analog Devices, Inc. and so on, are also preferred for production control and for high reliability as well. However, they either involves complicated fabrication procedures, or becomes too fragile for a drop test Q. Zou et al (Quanbo Zou, Zhijian Li, and Litian Liu, Design and Fabrication of Silicon Condenser Microphone Using Corrugated Diaphragm Technique, Journal of Microelectromechanical Systems, Vol. 5, No. 3, September 1996) proposed a single wafer condenser microphone with rectangular shaped corrugations formed all over the diaphragm, which is advantageous in reducing initial stress in the diaphragm and rendering the microphone a high sensitivity. However, the disadvantages of the microphone are that bridging parts are needed to be formed in the diaphragm for the backplate process and thus stress release for the diaphragm is not complete, and on the other hand, multiple corrugations on the whole diaphragm will actually increase the bending stiffness of the diaphragm and thus reduce the sensitivity of the microphone.

P. Scheeper et al (Patrick R. Scheeper, Wouter Olthuis, and Piet Bergveld, The Design, Fabrication and Testing of Corrugated Silicon Nitride Diaphragms, Journal of Microelectromechanical Systems, Vol. 3, No. 1, March 1994) disclosed a corrugated silicon nitride diaphragm for improving mechanical sensitivity under initial tensile stress. The mechanical sensitivity of the diaphragm is significantly improved, but at a penalty of increased diaphragm area (about 3 times larger than a normal design). A large static deflection of the diaphragm up to 2~7 µm is observed due to a large diaphragm area having multiple (8) ring-shaped corrugations formed therein, which made it unrealistic to construct a MEMS microphone in which the air gap between the diaphragm and the backplate is typically a few microns. Besides, multiple corrugations on the diaphragm will also increase the bending stiffness of the diaphragm and thus reduce the sensitivity of the diaphragm.

SUMMARY

In order to solve the above problem, the present invention provides a silicon microphone with a high-aspect-ratio corrugated diaphragm, as well as a package with the same, which may eliminate the stress effects on the mechanical sensitivity and the static deflection of the diaphragm, and not increase the bending stiffness of the diaphragm of the microphone, and thus improve the sensitivity and reproducibility of the microphone, meanwhile may represent a high reliability in a drop test and a low cost in fabrication.

In one aspect of the present invention, there is provided a silicon microphone with a high-aspect-ratio corrugated diaphragm, comprising: a silicon substrate provided with a back hole therein; the corrugated diaphragm disposed above the back hole of the silicon substrate, the corrugated diaphragm is flexible; a perforated backplate disposed above the diaphragm with an air gap sandwiched in between, wherein the diaphragm and the backplate are used to form electrode plates of a variable condenser, wherein at least one ring-shaped corrugation is formed in the vicinity of the edge of the diaphragm which is fixed to the substrate, and wherein the ratio of the depth of the corrugation to the thickness of the diaphragm is larger than 5:1, and the walls of the corrugation are inclined to the surface of the diaphragm at an angle in the range of 80° to 100°.

Preferably, the ratio of the depth of the corrugation to the thickness of the diaphragm may be larger than 20:1. More preferably, one ring-shaped corrugation may be formed in the vicinity of the edge of the diaphragm and the ratio of the depth of the corrugation to the thickness of the diaphragm may be larger than 20:1.

Preferably, the silicon microphone with the high-aspect-ratio corrugated diaphragm may further comprise dimples protruding from the lower surface of the perforated backplate, and/or protruding from the upper surface of the diaphragm.

Preferably, the diaphragm may be formed with a polysilicon layer.

In another aspect of the present invention, there is provided a microphone package, comprising a PCB board; the above described silicon microphone with the high-aspect-ratio corrugated diaphragm mounted on the PCB board; and a cover, enclosing the microphone, wherein an acoustic port is formed on any of the PCB board and the cover.

In still another aspect of the present invention, there is provided another microphone package, comprising a PCB board; a diaphragm module flip-chip mounted on the PCB board; and a cover enclosing the diaphragm module, wherein an acoustic port is formed on any of the PCB board and the cover, wherein the diaphragm module comprises: a silicon substrate provided with a back hole therein; a flexible diaphragm disposed above the back hole of the silicon substrate; and a spacer disposed above the diaphragm and surrounding the edge thereof, wherein the spacer of the diaphragm module is bonded to the PCB board, the diaphragm of the diaphragm module and the metal layer originally stacked on the PCB board and now located opposite to the diaphragm with an air gap sandwiched in between are used to form electrode plates of a variable condenser microphone, wherein at least one ring-shaped corrugation is formed in the vicinity of the edge of the diaphragm which is fixed to the substrate, and wherein the ratio of the depth of the corrugation to the thickness of the diaphragm is larger than 5:1, and the walls of the corrugation are inclined to the surface of the diaphragm at an angle in the range of 80° to 100°.

Preferably, one ring-shaped corrugation may be formed in the vicinity of the edge of the diaphragm and the ratio of the depth of the corrugation to the thickness of the diaphragm may be larger than 20:1.

Preferably, the spacer may be formed with a conductive metal/alloy layer.

The silicon microphone with the high-aspect-ratio corrugated diaphragm according to the present invention is advantageous in that, the performances such as sensitivity thereof are insensitive to the diaphragm initial stress, therefore a consistent and optimal sensitivity can be achieved in the present invention, and thus the reproducibility and the yield can be improved; single corrugation with an aspect ratio larger than 20:1 may provide the diaphragm with the best mechanical sensitivity and the least warpage or static deflection, and thus a better reproducibility and manufacturability; the impact applied thereto in a drop test can be greatly lowered, since the induced stress in a drop test is all evenly distributed along the whole ring-shaped corrugation, which is much less concentrated than that in a diaphragm with opening slots, thus the microphones of the present invention have a much higher robust and reliability.

The microphone package according to an embodiment of the present invention is advantageous in that, besides the advantages described above, the wafer processing is simplified, the cost is lowered and the yield is improved; the parasitic capacitance on PCB coupling is low, thus the sensitivity and the SNR can potentially be improved by 2-6 dB; the air gap is large, hence the acoustic resistance is low and the signal-to-noise ratio is high; more back-volume is available for the microphone, meanwhile, the zero front-volume nevertheless has no impact on the high frequency response of the microphone due to the Helmholtz resonance.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which.

DETAILED DESCRIPTION

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

In the description and the appended claims, it will be understood that, when a layer, a region, or a component is referred to as being "on" or "under" another layer, another region, or another component, it can be "directly" or "indirectly" on or under the another layer, region, or component, or one or more intervening layers may also be present.

Figure 1:
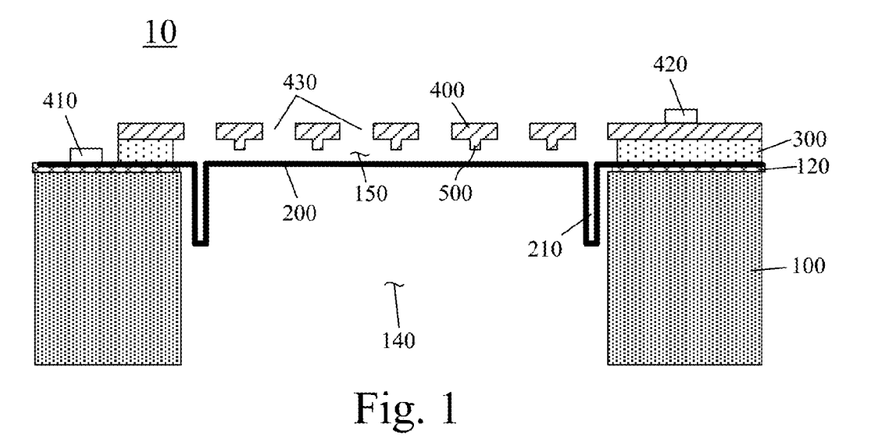
FIG. 1 is a cross-sectional view showing the exemplary structure of the silicon microphone with the high-aspect-ratio corrugated diaphragm according to an embodiment of the present invention.

FIG. 1 is a cross-sectional view showing the exemplary structure of the silicon microphone with the high-aspect-ratio corrugated diaphragm according to an embodiment of the present invention. As shown in FIG. 1, the silicon microphone 10 according to the embodiment of the present invention mainly comprises a silicon substrate 100 provided with a back hole 140 therein, a flexible diaphragm 200 disposed above the back hole 140 of the silicon substrate 100, and a perforated backplate 400 disposed above the diaphragm 200 with an air gap 150 sandwiched in between, the diaphragm 200 and the backplate 400 are used to form electrode plates of a variable condenser, which may receive an acoustic signal and transform the received acoustic signal into an electrical signal for the subsequent processing and output.

Specifically, the flexible diaphragm 200 may be supported on the silicon substrate 100 with an oxide layer 120 sandwiched in between. In addition, the diaphragm 200 is conductive, and thus may serve as an electrode, as well as a vibration membrane which vibrates in response to an external acoustic wave or a sound pressure impact reaching the diaphragm 200 through the back hole 140. Preferably, the diaphragm 200 may be formed with a polysilicon layer.

Figure 2:
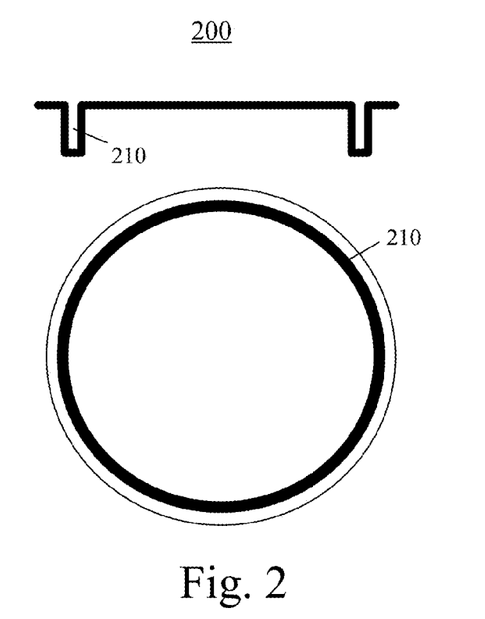
FIG. 2 is a schematic view, showing the cross-section view (on the upper part) and the plan view (on the lower part) of the diaphragm 200 according to the present embodiment.

FIG. 2 is a schematic view, showing the cross-section view (on the upper part) and the plan view (on the lower part) of the diaphragm 200 according to the present embodiment. As shown in FIG. 2, according to the present embodiment, one ring-shaped corrugation 210 is formed in the vicinity of the edge of the diaphragm 200 which is fixed to the substrate 100, and the ratio of the depth of the corrugation 210 to the thickness of the diaphragm 200 (i.e. the aspect ratio) is larger than 5:1, and the walls of the corrugation 210 are inclined to the surface of the diaphragm 200 at an angle in the range of 80° to 100°. In other preferred embodiments, more than one ring-shaped corrugation may be formed in the vicinity of the edge of the diaphragm 200, and in addition, the ratio of the depth of the corrugation 210 to the thickness of the diaphragm 200 may be preferably larger than 20:1.

The perforated backplate 400 may be formed with CMOS passivation layers with a metal layer imbedded therein which serves as an electrode plate of the backplate 400, or the perforated backplate 400 may be formed with a polysilicon layer or a SiGe layer, or the perforated backplate 400 may be formed with a patterned electro-plated metal layer (e.g., Ni, Cu, or Au etc). The backplate 400 provides another electrode of the microphone 10, and has a plurality of through holes 430 formed therein, which are used for air ventilation so as to reduce air damping that the diaphragm 200 will encounter when starts vibrating.

The air gap 150 is provided between the diaphragm 200 and the backplate 400 with a spacer 300 forming the boundary thereof. The spacer 300 may be formed with CMOS dielectric silicon oxide layers, or any other dielectric layers including but not limited to silicate-glasses or polymers. In addition, the silicon microphone 10 according to the present embodiment may have an extraction electrode 410 for the diaphragm 200 and an extraction electrode 420 for the backplate 400.

Also, in present embodiment, the silicon microphone 10 may further include dimples 500 protruding from the lower surface of the perforated backplate 400 opposite to the diaphragm 200, and used to prevent the diaphragm 200 from sticking to the backplate 400. However, the present invention is not limited thereto, in other embodiments, the dimples 500 may protrude from the upper surface of the diaphragm 200.

Hereinafter, the performances of the silicon microphone with a high-respect-ratio corrugated diaphragm according to the present invention will be described in conjunction with simulation results shown in FIG. 3 to FIG. 5, the simulations are done with a simulation software Comsol V 4.4.

Figure 3:
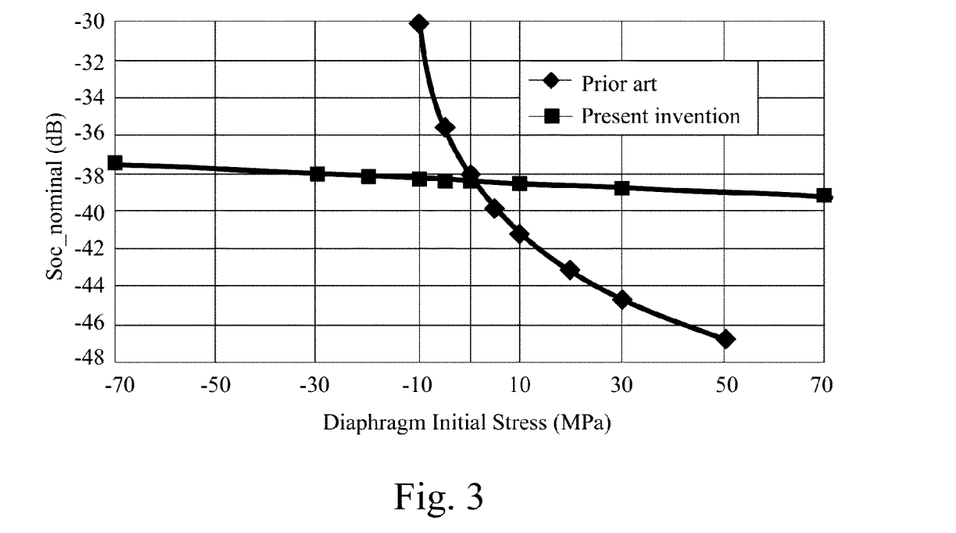
FIG. 3 is a chart, showing simulated open-circuit-sensitivity versus diaphragm initial stress for the microphone according to an embodiment of the present invention and the microphone of the prior art.

FIG. 3 is a chart, showing simulated open-circuit-sensitivity versus diaphragm initial stress for the microphone according to an embodiment of the present invention and the microphone of the prior art. In this simulation, a circular diaphragm with a diameter of 640 μm and a thickness of 1 μm is adopted for the microphone according to the present invention, one corrugation with a width of 5 μm, a depth of 20 μm, and thus an aspect ratio of 20:1 is formed on the diaphragm, the distance between the edge of the diaphragm and the center of the corrugation is 20 μm, and the initial stress of the diaphragm is assumed to be in the range of −70 MPa to 70 MPa, however, the conclusions drawn from the simulation results do not rely on the parameter values adopted thereabove. The open-circuit-sensitivity (Soc) may be defined as the open circuit output voltage under unit sound pressure.

As shown in FIG. 3, Soc of the microphone with the high-aspect-ratio corrugated diaphragm according to the present embodiment is not sensitive to the initial stress of the diaphragm, and thus the microphone according to the present invention can clearly tolerate an initial stress in a much wider range, which means there is no special request for diaphragm stress control during the fabrication of the microphone according to the present invention. In contrast, for most silicon microphones in the prior art, diaphragm stress control is indispensible during the fabrication of the microphones, since the initial stress of the diaphragm may have a great effect on the sensitivity of the microphones, as is the case shown in FIG. 3 for a microphone of the prior art, in which a narrow slot is formed around the edge of the diaphragm to release the stress in the diaphragm. In details, the sensitivity of a microphone is determined by dimensional parameters of the microphone and the initial stress of the diaphragm. The dimensional errors of the microphone can be controlled within 2%-3%, however, the initial stress of the diaphragm can vary in a much wider range (20% or more). Therefore, the initial stress control of the diaphragm is critical in determining the performances of the microphone, such as sensitivity, reliability, and reproducibility and so on. Since the performances such as sensitivity of the microphone with the high-aspect-ratio corrugated diaphragm is insensitive to the diaphragm initial stress, a consistent and optimal sensitivity can be achieved in the present invention, and thus the reproducibility and the reliability can be improved, and there is no need to adopt the scheme of Vpi binning and ASIC Vp matching as implemented in Infineon Technologies.

Figure 4:
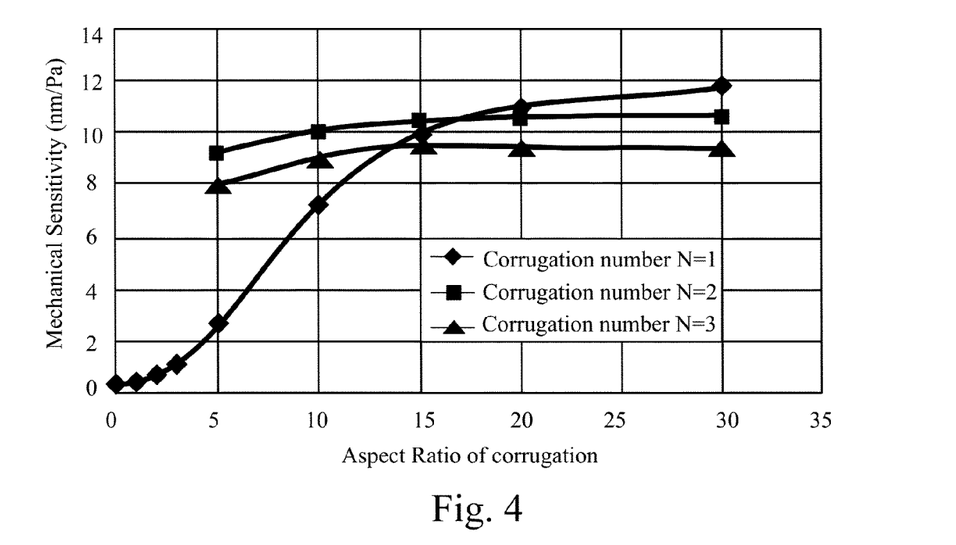
FIG. 4 is a chart, showing simulated mechanical sensitivity versus aspect ratio for the microphones according to the embodiments of the present invention.

FIG. 4 is a chart, showing simulated mechanical sensitivity versus aspect ratio for the microphones according to the embodiments of the present invention. In this simulation, the mechanical sensitivities of three microphones according to the present invention, which have one, two, three corrugations formed on the circular diaphragms thereof, respectively, are simulated with the initial stress of the diaphragm assumed to be 70 MPa. Specifically, the diaphragms of the three microphones have a diameter of 640 μm and a thickness of 1 μm, the corrugations formed on the diaphragms of the three microphones has a width of 5 μm, the distance between the edge of each diaphragm and the center of the corrugation adjacent thereto and the distance between the centers of any two adjacent corrugations are 20 μm, however, the conclusions drawn from the simulation results do not rely on the parameter values adopted thereabove. The aspect ratio of the corrugation is defined as the ratio of the depth of the corrugation to the thickness of the diaphragm, the mechanical sensitivity (Sm) is defined as the diaphragm displacement (or deflection) under unit sound pressure.

As shown in FIG. 4, the high-aspect-ratio corrugated diaphragm, in which the aspect ratio of the corrugation(s) is larger than 5:1, and preferably larger than 20:1, may provide a much higher mechanical sensitivity for the microphone as compared to the conventional low-aspect-ratio corrugated (i.e. shallowly corrugated) diaphragm. Especially, single corrugation with an aspect ratio larger than 20:1 may provide the diaphragm with the best mechanical sensitivity and, as practice shows, the least warpage, for example, a maximum static deflection less than 0.13 µm has been observed in a deeply corrugated diaphragm with an initial stress of 70 MPa, compared to the diaphragm deflection of 2~7 µm in the prior-art mentioned before.

Figure 5:
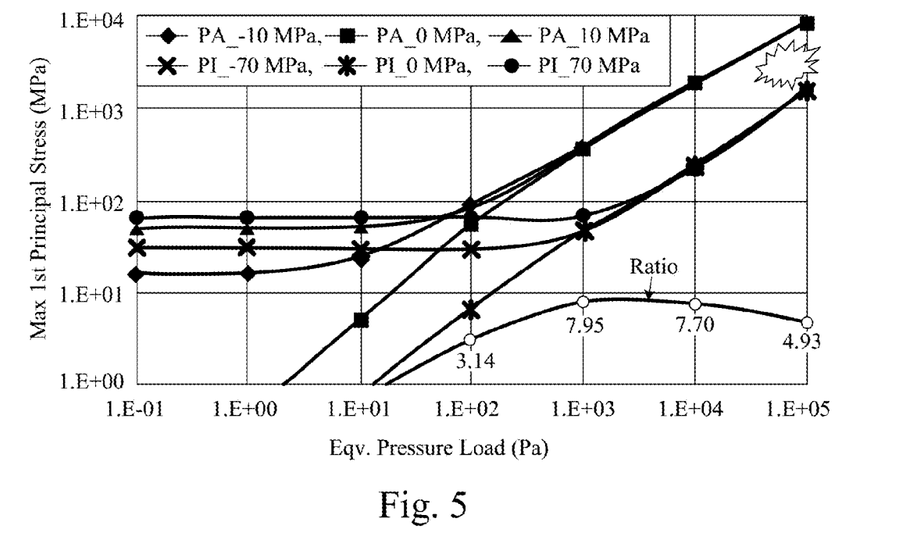
FIG. 5 is a chart, showing stress risk comparisons in a drop test among the microphones with the high-aspect-ratio corrugated diaphragm according to the present invention and the microphones of the prior art.

FIG. 5 is a chart, showing stress risk comparisons in a drop test among the microphones with the high-aspect-ratio corrugated diaphragm according to the present invention and the microphones of the prior art. In details, FIG. 5 shows simulated maximum first principal stress appearing in the diaphragm versus equivalent pressure load applied to the diaphragm in a drop test or at a very high sound pressure level (SPL) for the microphones of the present invention (PI) and the microphones of the prior art (PA), in each of which a narrow slot is formed around the edge of the diaphragm to release the stress in the diaphragm. Also, FIG. 5 shows the maximum first principal stress ratio between the microphones of the present invention and the microphones of the prior art. In this simulation, three microphones of the present invention in which structure dimensions are correspondingly same but the initial stresses of the diaphragms are assumed to be −70 MPa, 0 MPa, and 70 MPa, respectively, and three microphones of the prior art in which structure dimensions are correspondingly same but the initial stresses of the diaphragms are assumed to be −10 MPa, 0 MPa, and 10 MPa, respectively, are adopted. Specifically, the three microphones of the present invention have a circular diaphragm with a diameter of 640 µm and a thickness of 1 µm, on which one corrugation with a width of 5 µm, a depth of 20 µm, and thus an aspect ratio of 20:1 is formed, wherein the distance between the edge of the diaphragm and the center of the corrugation is 20 µm, however, the conclusions drawn from the simulation results do not rely on the parameter values adopted thereabove. In addition, the very high SPL is assumed to be in a steady state.

As shown in FIG. 5, the maximum first principal stress appearing in the diaphragm when a pressure load is applied to the diaphragm in a drop test is much lower for the microphones of the present invention than for the microphones of the prior art. Actually, in a drop test, the impact applied to the microphones of the present invention is only ⅕ to ⅛ as big as that applied to the microphones of the prior art, thus, the microphones of the present invention have a much higher robust and reliability.

The above described silicon microphone with the high-aspect-ratio corrugated diaphragm can be packaged into a microphone package. Actually, a microphone package according to an embodiment of the present invention may comprise a PCB board; an above described silicon microphone with the high-aspect-ratio corrugated diaphragm mounted on the PCB board; and a cover, enclosing the microphone, wherein an acoustic port is formed on the PCB board and the cover.

Figure 6:
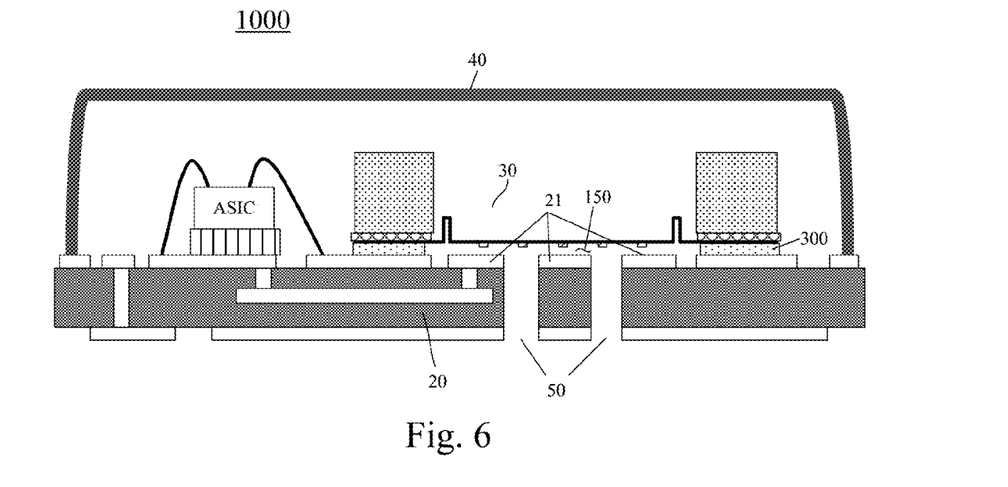
FIG. 6 is a cross-sectional view showing the exemplary structure of a microphone package according to another embodiment of the present invention.

FIG. 6 is a cross-sectional view showing the exemplary structure of a microphone package according to another embodiment of the present invention. As shown in FIG. 6, the microphone package 1000 according to another embodiment of the present invention comprises a PCB board 20; a diaphragm module 30 flip-chip mounted on the PCB board 20; and a cover 40 enclosing the diaphragm module 30, wherein an acoustic port 50 is formed on the PCB board 20, however, the present invention is not limited thereto, the acoustic port 50 may be formed on the cover 40.

Figure 7:
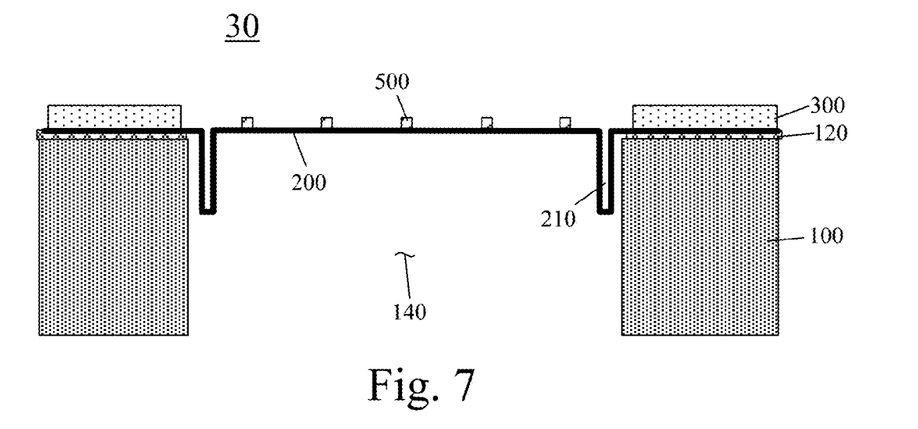
FIG. 7 is a cross-sectional view showing the exemplary structure of the diaphragm module of FIG. 6.

FIG. 7 is a cross-sectional view showing the exemplary structure of the diaphragm module 30 of FIG. 6. As shown in FIG. 7, the diaphragm module 30 mainly comprises a silicon substrate 100 provided with a back hole 140 therein; a flexible diaphragm 200 disposed above the back hole 140 of the silicon substrate 100; and a spacer 300 disposed above the diaphragm 200 and surrounding the edge thereof. Specifically, the flexible diaphragm 200 may be supported on the silicon substrate 100 with an oxide layer 120 sandwiched in between. In addition, the diaphragm 200 is conductive, and thus may serve as an electrode, as well as a vibration membrane which vibrates in response to an external acoustic wave or a sound pressure impact reaching the diaphragm 200. Preferably, the diaphragm 200 may be formed with a polysilicon layer.

One ring-shaped corrugation 210 is formed in the vicinity of the edge of the diaphragm 200 which is fixed to the substrate 100, and the ratio of the depth of the corrugation 210 to the thickness of the diaphragm 200 (i.e. the aspect ratio) is larger than 5:1, and the walls of the corrugation 210 are inclined to the surface of the diaphragm 200 at an angle in the range of 80° to 100°. In other preferred embodiments, more than one ring-shaped corrugation may be formed in the vicinity of the edge of the diaphragm 200, and in addition, the ratio of the depth of the corrugation 210 to the thickness of the diaphragm 200 may be preferably larger than 20:1.

Preferably, the spacer 300 may be a conductive metal/alloy layer with a well-controlled thickness (e.g. a ring-shaped electro-plated Au layer with a thickness of 5~20 µm). The metal/alloy spacer 300 can be bonded to a corresponding metal pad on the PCB board 20 by a thermal sonic or eutectic bonding process so that the diaphragm module 30 can be flip-chip mounted on the PCB board 20. In this scenario, since the spacer 300 is formed to be a narrow metal/alloy ring, the parasitic capacitance of microphone can be potentially minimized and the fabrication cost can be further reduced as well.

In addition, the diaphragm module 30 may further include dimples 500 protruding from the upper surface of the diaphragm 200.

When the spacer 300 of the diaphragm module 30 is bonded to the PCB board 20, the diaphragm 200 of the diaphragm module 30 and the metal layer 21 originally stacked on the PCB board 20 and now located opposite to the diaphragm 200 with an air gap 150 sandwiched in between are used to form electrode plates of a variable condenser microphone. In other words, the metal layer 21 may function as a backplate 400 of the silicon microphone 10 as described above, and the thickness of the spacer 300 may be the main contributor to the thickness of the air gap 150.

In addition, the microphone package 1000 may further comprise ASIC assemblies wire-bonded to or flip-chip mounted on the PCB board 20, which can perform signal processing for the output signal of the variable condenser microphone in the microphone package 1000 and so on.

As described above, in microphone package 1000, the diaphragm module 30 and the metal layer 21 of the PCB board 20 are combined into a microphone. The microphone package 1000 is advantageous over the microphone package comprising the microphone 10 mounted on the PCB board in that, first, there is no need to form the perforated backplate 400, and thus the wafer processing is simplified, the cost is lowered and the yield is improved; second, the on-chip pad and interconnect capacitances are eliminated, and thus the parasitic capacitance on PCB coupling is low, the sensitivity and the SNR can potentially be improved by 2-6 dB; third, the air gap 150 is large, hence the acoustic resistance is low and the signal-to-noise ratio is high; and fourth, the diaphragm is close to the PCB board, and thus more back-volume is available for the microphone, meanwhile, the zero front-volume nevertheless has no impact on the high frequency response of the microphone due to the Helmholtz resonance.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. A silicon microphone with a high-aspect-ratio corrugated diaphragm, the silicon microphone comprising:
   a silicon substrate provided with a back hole therein;
   the corrugated diaphragm disposed above the back hole of the silicon substrate, the corrugated diaphragm is flexible; and
   a perforated backplate disposed above the diaphragm with an air gap sandwiched in between,
   wherein the diaphragm and the backplate are used to form electrode plates of a variable condenser,
   wherein at least one ring-shaped corrugation is formed in the vicinity of the edge of the diaphragm which is fixed to the substrate,
   wherein the perforated backplate does not extend into the corrugation,
   wherein the silicon microphone comprises protrusions protruding from the lower surface of the perforated backplate and protruding from the upper surface of the diaphragm, and
   wherein the ratio of the depth of the corrugation to the thickness of the diaphragm is larger than 5:1, and the walls of the corrugation are inclined to the surface of the diaphragm at an angle in the range of 80° to 100°.

2. A silicon microphone with a high-aspect-ratio corrugated diaphragm of claim 1, wherein the ratio of the depth of the corrugation to the thickness of the diaphragm is larger than 20:1.

3. A silicon microphone with a high-aspect-ratio corrugated diaphragm of claim 1, wherein one ring-shaped corrugation is formed in the vicinity of the edge of the diaphragm and the ratio of the depth of the corrugation to the thickness of the diaphragm is larger than 20:1.

4. A silicon microphone with a high-aspect-ratio corrugated diaphragm of claim 1,
   wherein the perforated backplate is formed with CMOS passivation layers with a metal layer imbedded therein.

5. A silicon microphone with a high-aspect-ratio corrugated diaphragm of claim 1, wherein the diaphragm is formed with a polysilicon layer, and the spacer is formed with CMOS dielectric silicon oxide layers.

6. A microphone package, comprising a PCB board; the silicon microphone with the high-aspect-ratio corrugated diaphragm of claim 1 mounted on the PCB board; and a cover, enclosing the microphone, wherein an acoustic port is formed on any of the PCB board and the cover.

7. A microphone package, comprising a PCB board; a diaphragm module flip-chip mounted on the PCB board; and a cover enclosing the diaphragm module, wherein an acoustic port is formed on any of the PCB board and the cover,
   wherein the diaphragm module comprises: a silicon substrate provided with a back hole therein; a flexible diaphragm disposed above the back hole of the silicon substrate; and a spacer disposed above the diaphragm and surrounding the edge thereof,
   wherein the spacer of the diaphragm module is bonded to the PCB board, the diaphragm of the diaphragm module and the metal layer originally stacked on the PCB board and now located opposite to the diaphragm with an air gap sandwiched in between are used to form electrode plates of a variable condenser microphone,
   wherein at least one ring-shaped corrugation is formed in the vicinity of the edge of the diaphragm which is fixed to the substrate, and wherein the ratio of the depth of the corrugation to the thickness of the diaphragm is larger than 5:1, and the walls of the corrugation are inclined to the surface of the diaphragm at an angle in the range of 80° to 100°, and
   wherein the microphone package further comprises protrusions protruding from a surface of the diaphragm in a direction away from the silicon substrate.

8. A microphone package of claim 7, wherein the ratio of the depth of the corrugation to the thickness of the diaphragm is larger than 20:1.

9. A microphone package of claim 7, wherein one ring-shaped corrugation is formed in the vicinity of the edge of the diaphragm and the ratio of the depth of the corrugation to the thickness of the diaphragm is larger than 20:1.

10. A microphone package of claim 7, wherein the spacer is formed with a conductive metal/alloy layer.

11. A microphone package of claim 7, wherein the diaphragm is formed with a polysilicon layer.

12. A microphone package of claim 7, wherein the spacer is a ring-shaped electro-plated Au layer with a thickness of 5 μm to 20 μm.

* * * * *